United States Patent
Hirano

(10) Patent No.: US 12,101,886 B2
(45) Date of Patent: Sep. 24, 2024

(54) ELECTRONIC APPARATUS AND SUBSTRATE

(71) Applicant: SONY GROUP CORPORATION, Tokyo (JP)

(72) Inventor: Keiichi Hirano, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 136 days.

(21) Appl. No.: 17/432,376

(22) PCT Filed: Jan. 22, 2020

(86) PCT No.: PCT/JP2020/002085
§ 371 (c)(1),
(2) Date: Aug. 19, 2021

(87) PCT Pub. No.: WO2020/174941
PCT Pub. Date: Sep. 3, 2020

(65) Prior Publication Data
US 2022/0256708 A1     Aug. 11, 2022

(30) Foreign Application Priority Data
Feb. 28, 2019 (JP) .................... 2019-035441

(51) Int. Cl.
*H05K 1/02* (2006.01)
*H05K 1/11* (2006.01)
(Continued)

(52) U.S. Cl.
CPC ............ *H05K 1/181* (2013.01); *H05K 1/028* (2013.01); *H05K 1/0298* (2013.01); *H05K 1/11* (2013.01);
(Continued)

(58) Field of Classification Search
CPC ...... H05K 1/181; H05K 1/028; H05K 1/0298; H05K 1/11; H05K 2201/10015;
(Continued)

(56) References Cited

U.S. PATENT DOCUMENTS 6,373,714 B1 * 4/2002 Kudoh .................. H05K 1/141
361/736
6,444,921 B1 * 9/2002 Wang ..................... H05K 1/147
439/91
(Continued)

FOREIGN PATENT DOCUMENTS

| CA | 3023018 A1 | 11/2017 |
|---|---|---|
| CN | 1315114 A | 9/2001 |

(Continued)

OTHER PUBLICATIONS

International Search Report and Written Opinion of PCT Application No. PCT/JP2020/007850, issued on Jun. 2, 2020, 09 pages of ISRWO.

(Continued)

*Primary Examiner* — Steven T Sawyer
(74) *Attorney, Agent, or Firm* — CHIP LAW GROUP

(57) ABSTRACT

Provided are an electronic apparatus and a substrate capable of reducing the size and the cost thereof regardless of whether or not a shielding function is needed. An electronic apparatus includes a substrate including a first substrate portion and a second substrate portion arranged in a position opposite the first substrate portion, and a capacitor component arranged between the first substrate portion and the second substrate portion and attached to at least one of the first substrate portion and the second substrate portion. The capacitor component includes a dielectric, a first electrode located on one side of the dielectric, and a second electrode located through the dielectric on a side opposite to the first electrode. The first substrate portion and the second sub- (Continued)

strate portion are electrically connected to each other through the first electrode.

18 Claims, 11 Drawing Sheets

(51) Int. Cl.
*H05K 1/14* (2006.01)
*H05K 1/18* (2006.01)

(52) U.S. Cl.
CPC ............. *H05K 1/147* (2013.01); *H05K 1/145* (2013.01); *H05K 2201/042* (2013.01); *H05K 2201/10015* (2013.01)

(58) Field of Classification Search
CPC ... H05K 2201/042; H05K 2201/10636; H05K 1/0231; H05K 1/145; H05K 1/118; H05K 1/148; H05K 1/147; H01L 25/0657; H01L 23/552; H01L 25/16
See application file for complete search history.

(56) References Cited

U.S. PATENT DOCUMENTS

| 6,762,789 | B1 | 7/2004 | Sogabe et al. | |
|---|---|---|---|---|
| 2004/0125580 | A1* | 7/2004 | Chung | H05K 1/0231 361/794 |
| 2008/0310135 | A1* | 12/2008 | Schack | H05K 7/14 29/830 |
| 2012/0153448 | A1* | 6/2012 | Ihara | H01L 21/76838 257/E21.705 |
| 2012/0170231 | A1* | 7/2012 | Lee | H05K 1/145 29/831 |
| 2013/0250528 | A1* | 9/2013 | Horibe | H05K 3/284 361/748 |
| 2015/0022978 | A1 | 1/2015 | Steuer et al. | |
| 2015/0098196 | A1* | 4/2015 | Palmer | H05K 3/0091 29/829 |
| 2015/0366063 | A1* | 12/2015 | Takagi | H01L 23/49811 29/831 |
| 2017/0316806 | A1 | 11/2017 | Warren et al. | |
| 2018/0206340 | A1* | 7/2018 | Yamaura | H05K 3/284 |
| 2022/0404881 | A1* | 12/2022 | Burski | G06F 1/187 |

FOREIGN PATENT DOCUMENTS

| CN | 109417655 A | 3/2019 |
|---|---|---|
| EP | 1117256 A1 | 7/2001 |
| EP | 3242273 A1 | 11/2017 |
| JP | S63-90882 U | 6/1988 |
| JP | H02-88268 U | 7/1990 |
| JP | H06021681 A | 1/1994 |
| JP | H08330682 A | 12/1996 |
| JP | 2000-114686 A | 4/2000 |
| JP | 2001-008232 A | 1/2001 |
| JP | 2009-117409 A | 5/2009 |
| JP | 2012-129355 A | 7/2012 |
| JP | 2015-053298 A | 3/2015 |
| JP | 2015-230632 A | 12/2015 |
| JP | 2018-206353 A | 12/2018 |
| KR | 10-2019-0002539 A | 1/2019 |
| WO | 2001/005154 A1 | 1/2001 |
| WO | 2012/077522 A1 | 6/2012 |
| WO | 2017/192125 A1 | 11/2017 |

OTHER PUBLICATIONS

International Search Report and Written Opinion of PCT Application No. PCT/JP2020/002085, issued on Apr. 14, 2020, 11 pages of English Translation and 08 pages of ISRWO.

International Preliminary Report on Patentability of PCT Application No. PCT/JP2020/002085, issued on Sep. 10, 2021, 10 pages of English Translation and 05 pages of IPRP.

* cited by examiner

ELECTRONIC APPARATUS AND SUBSTRATE

CROSS REFERENCE TO RELATED APPLICATIONS

This application is a U.S. National Phase of International Patent Application No. PCT/JP2020/002085 filed on Jan. 22, 2020, which claims priority benefit of Japanese Patent Application No. JP 2019-035441 filed in the Japan Patent Office on Feb. 28, 2019. Each of the above-referenced applications is hereby incorporated herein by reference in its entirety.

TECHNICAL FIELD

The present disclosure relates to an electronic apparatus and a substrate.

BACKGROUND ART

An electronic apparatus is known in which electronic components are covered with a metallic shield case and thus the entry of electromagnetic waves from outside the shield case into the electronic components is prevented and the leakage of electromagnetic waves from the electronic components to the outside of the shield case is prevented. A technique of using, instead of a metallic shield case, a shield portion formed when a circuit substrate is manufactured so as to block electromagnetic waves is also known (see, for example, PTL 1).

CITATION LIST

Patent Literature

[PTL 1]
Japanese Patent Laid-open No. 2015-53298

SUMMARY

Technical Problem

There is a demand for a reduction in size and cost of electronic apparatuses regardless of whether or not a shielding function is needed.

The present disclosure is made in view of the circumstances as described above, and an object is to provide an electronic apparatus and a substrate capable of reducing the size and the cost thereof regardless of whether or not a shielding function is needed.

Solution to Problem

An electronic apparatus according to an aspect of the present disclosure includes a substrate including a first substrate portion and a second substrate portion arranged in a position opposite the first substrate portion, and a capacitor component arranged between the first substrate portion and the second substrate portion and attached to at least one of the first substrate portion and the second substrate portion. The capacitor component includes a dielectric, a first electrode located on one side of the dielectric, and a second electrode located through the dielectric on a side opposite to the first electrode. The first substrate portion and the second substrate portion are electrically connected to each other through the first electrode. For example, the first electrode is fixed to a given potential.

In this way, the first electrode of the capacitor component functions as a shield that blocks electromagnetic waves. The first electrode of the capacitor component can prevent the entry of electromagnetic waves from outside the electronic apparatus (hereinafter, the outside world) thereinto and the leakage of electromagnetic waves from within the electronic apparatus to the outside world. The size and the arrangement of the capacitor components can be designed freely. For example, the thickness of the capacitor components can be designed to be reduced, and the capacitor components can be selectively arranged in an area where electromagnetic waves are desired to be blocked. In this way, it is possible to realize an electromagnetic shield that cannot be realized by a conventional metal-plate shield case and that is flexibly suitable, and this significantly contributes to a reduction in the size. The conventional metal-plate shield case is replaced, and thus it is possible to eliminate the need for material and processing costs, with the result that the cost of the electronic apparatus can be reduced. It should be noted that the application of the first electrode is not limited to shielding. The application of the first electrode may be the electrical connection of the first substrate portion and the second substrate portion.

A substrate according to another aspect of the present disclosure includes a first substrate portion and a second substrate portion arranged in a position opposite the first substrate portion. The first substrate portion includes a first region to which a capacitor component is attached. The second substrate portion includes a second region to which the capacitor component is attached. The first region and the second region are opposite each other. In this way, it is possible to electrically connect the first electrode of the capacitor component to the first substrate and the second substrate and to thereby fix the first electrode to a given potential. The first electrode of the capacitor component can be used as a shield that blocks electromagnetic waves.

DESCRIPTION OF EMBODIMENTS

Figure 1:
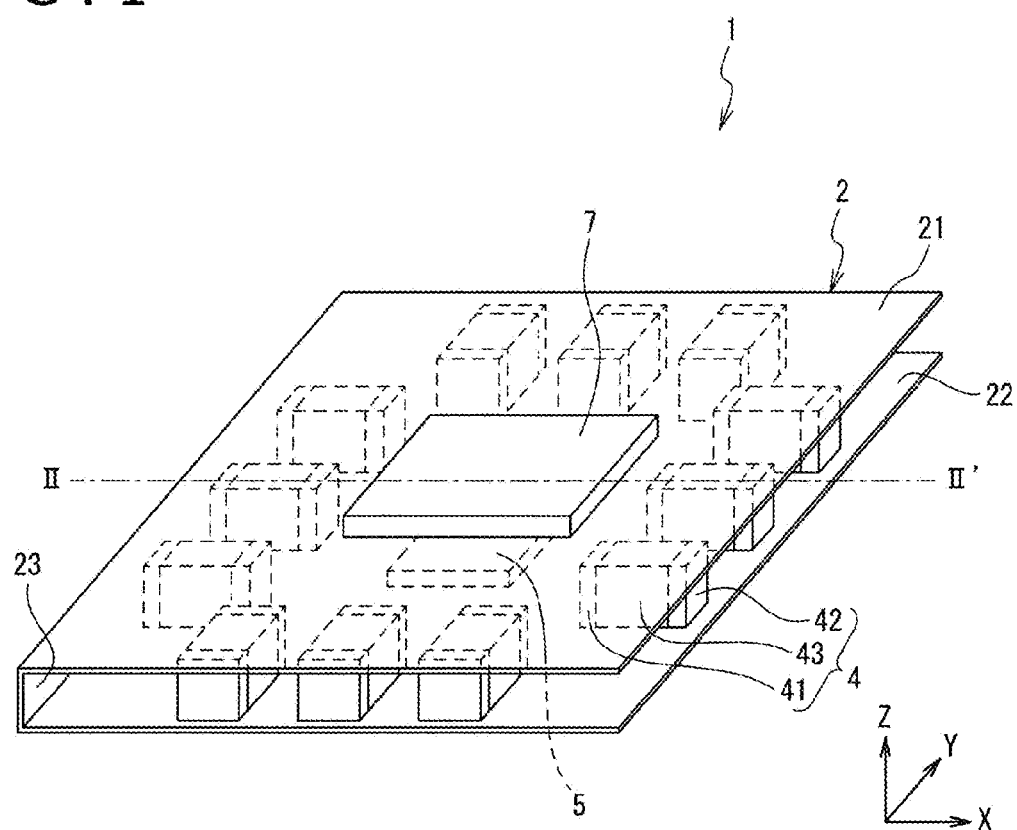
FIG. 1 is a perspective view illustrating an example of a configuration of an electronic apparatus according to an embodiment of the present disclosure.

An embodiment of the present disclosure will be described below with reference to drawings. In the illustration of the drawings referenced in the following description, the same or similar parts are denoted by the same or similar reference signs. However, it should be noted that the drawings are schematic and that a relation between thicknesses and planar dimensions, a ratio of the thicknesses of layers, and the like are different from the real ones. Hence, specific thicknesses and dimensions need to be determined according to the following description. Further, needless to say, in the drawings, a relation and a ratio between dimensions are partly different.

In addition, directions such as upward and downward directions in the following description are simply defined for the sake of convenience of description, and the definitions are not intended to limit the technical ideas of the present disclosure. For example, needless to say, when a target is turned by 90° and is observed, upward and downward directions are changed to leftward and rightward directions whereas, when the target is turned by 180° and is observed, upward and downward directions are reversed.

Moreover, in the following description, there is a case where an X axis direction, a Y axis direction, and a Z axis direction are used to mention directions. For example, the Z axis direction is the direction of thickness of an electronic apparatus 1 which will be described later. The X axis direction and the Y axis direction are directions orthogonal to the Z axis direction. The X axis direction, the Y axis direction, and the Z axis direction are orthogonal to each other. In the following description, "plan view" means seeing in the Z axis direction.

Embodiment

Figure 2:
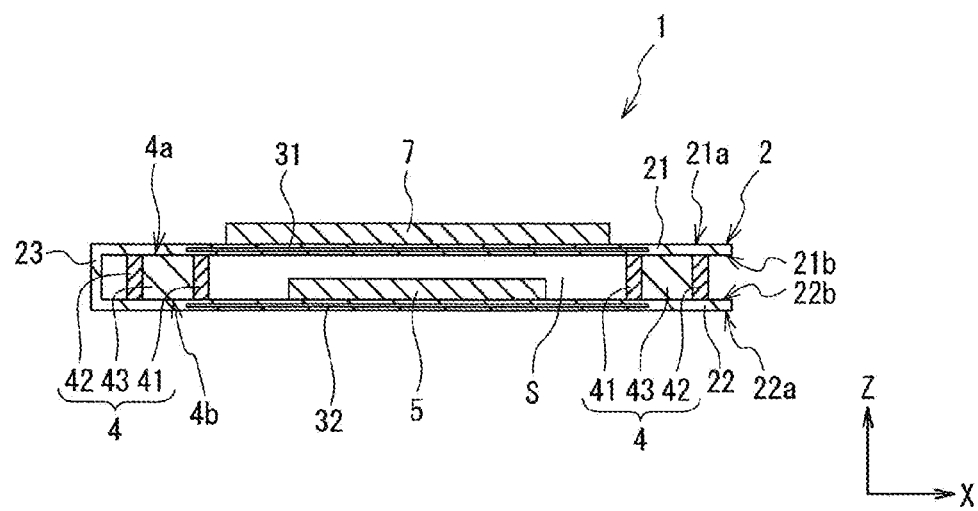
FIG. 2 is a cross-sectional view illustrating the example of the configuration of the electronic apparatus according to the embodiment of the present disclosure.

FIG. 1 is a perspective view illustrating an example of the configuration of an electronic apparatus according to the embodiment of the present disclosure. FIG. 2 is a cross-sectional view illustrating the example of the configuration of the electronic apparatus according to the embodiment of the present disclosure. FIG. 2 illustrates a cross section taken along an X-Z plane passing through line II-II' in FIG. 1. As illustrated in FIGS. 1 and 2, the electronic apparatus 1 includes a substrate 2, a plurality of capacitor components 4 (an example of a surface mount device) mounted on the substrate 2, and electronic components 5 and 7 mounted on the substrate 2. The electronic apparatus 1 may be referred to as a module.

The substrate 2 is, for example, a single sheet of flexible substrate having a multilayer wiring structure. The substrate 2 has a structure in which a plurality of wiring layers (hereinafter, wiring patterns) having patterns formed and a plurality of insulating layers are stacked in layers on at least one side of a flexible resin sheet. In the insulating layers, through holes are provided. The wiring pattern on the upper side and the wiring pattern on the lower side are connected to each other through the through holes. Even within the resin sheet, the wiring patterns and the insulating layers may be alternately stacked in layers. The insulator of the resin sheet is polyimide. The conductor of the wiring pattern is copper (Cu) or a Cu alloy having Cu as the main ingredient. Further, the substrate 2 includes insulating protective films on both surfaces thereof (the surface on the front side and the surface on the back side). The protective film is a solder resist or a cover lay.

The substrate 2 includes a first substrate portion 21, a second substrate portion 22, and a connection portion 23 that connects the first substrate portion 21 and the second substrate portion 22. In the substrate 2, a boundary portion between the first substrate portion 21 and the connection portion 23 and a boundary portion between the second substrate portion 22 and the connection portion 23 are bent such that the first substrate portion 21 and the second substrate portion 22 are opposite each other. In the following description, a state where the substrate 2 is bent around the connection portion 23 such that the first substrate portion 21 and the second substrate portion 22 are opposite each other is referred to as a bent state. Further, in the bent state, the surface of the substrate 2 facing outward is referred to as an outer surface, and the surface of the substrate 2 facing inward is referred to as an inner surface.

The first substrate portion 21 includes an outer surface 21a and an inner surface 21b. The second substrate portion 22 includes an outer surface 22a and an inner surface 22b. In the bent state, the inner surface 21b of the first substrate portion 21 and the inner surface 22b of the second substrate portion 22 are opposite each other through a space S.

The plurality of capacitor components 4 is arranged between the first substrate portion 21 and the second substrate portion 22. Each of the plurality of capacitor components 4 is surface-mounted on the side of the inner surface 21b of the first substrate portion 21 and the side of the inner surface 22b of the second substrate portion 22. Each of the plurality of capacitor components 4 is attached both to the first substrate portion 21 and to the second substrate portion 22 so as to be fixed in an upward-downward direction.

As illustrated in FIG. 2, the electronic component 5 is surface-mounted on a mounting region for the electronic component 5 on the side of the inner surface 22b of the second substrate portion 22. In the bent state, the electronic component 5 is arranged between the first substrate portion 21 and the second substrate portion 22. Since the thickness of the electronic component 5 is less than those of the capacitor components 4, the electronic component 5 is not in contact with the first substrate portion 21. A gap is present between an upper surface of the electronic component 5 and the inner surface 21b of the first substrate portion 21. The electronic component 7 is surface-mounted on a mounting region for the electronic component 7 on the side of the outer surface 21a of the first substrate portion 21. The electronic components 5 and 7 are, for example, integrated circuits (IC). In an example, the electronic component 5 is a central processing unit (CPU), and the electronic component 7 is an IC for power supply control.

Figure 3:
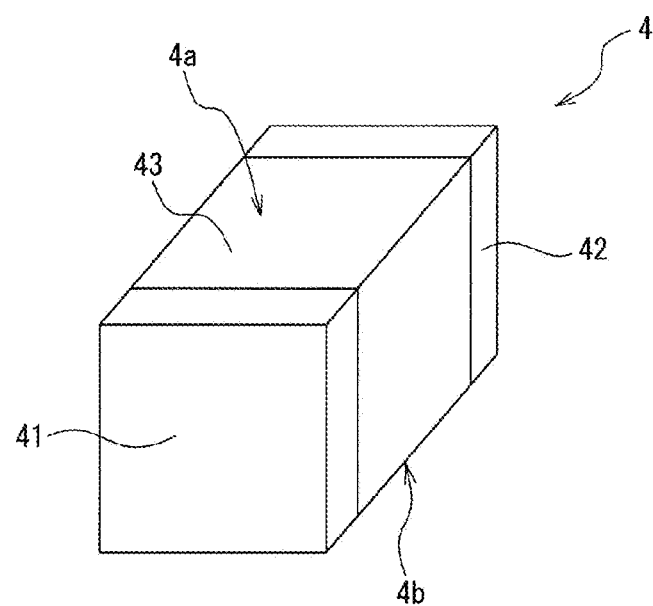
FIG. 3 is a perspective view illustrating an example of a configuration of a capacitor component according to the embodiment of the present disclosure.

FIG. 3 is a perspective view illustrating an example of the configuration of the capacitor component according to the embodiment of the present disclosure. As illustrated in FIG. 3, the capacitor component 4 includes a first electrode 41, a second electrode 42 arranged away from the first electrode 41, and a dielectric 43 (an example of a freely-selected component) arranged between the first electrode 41 and the second electrode 42. The first electrode 41 is located on one side of the dielectric 43, and the second electrode 42 is located through the dielectric 43 on the side opposite to the first electrode 41.

The capacitor component 4 is, for example, a ceramic capacitor in which its dielectric includes a ceramic. The shape of the capacitor component 4 is, for example, a rectangular parallelepiped. The capacitor component 4 includes an upper surface 4a and a lower surface 4b located on the side opposite to the upper surface 4a. As illustrated in FIG. 2, the upper surface 4a of the capacitor component 4 is attached to the first substrate portion 21. Further, in the bent state, the lower surface 4b of the capacitor component 4 is attached to the second substrate portion 22. The first electrode 41 is fixed to a given potential in which variations in potential are smaller than that of the second electrode 42. For example, the first electrode 41 is connected to a ground potential (0 V), and the second electrode 42 is connected to a power supply potential.

Figure 4:
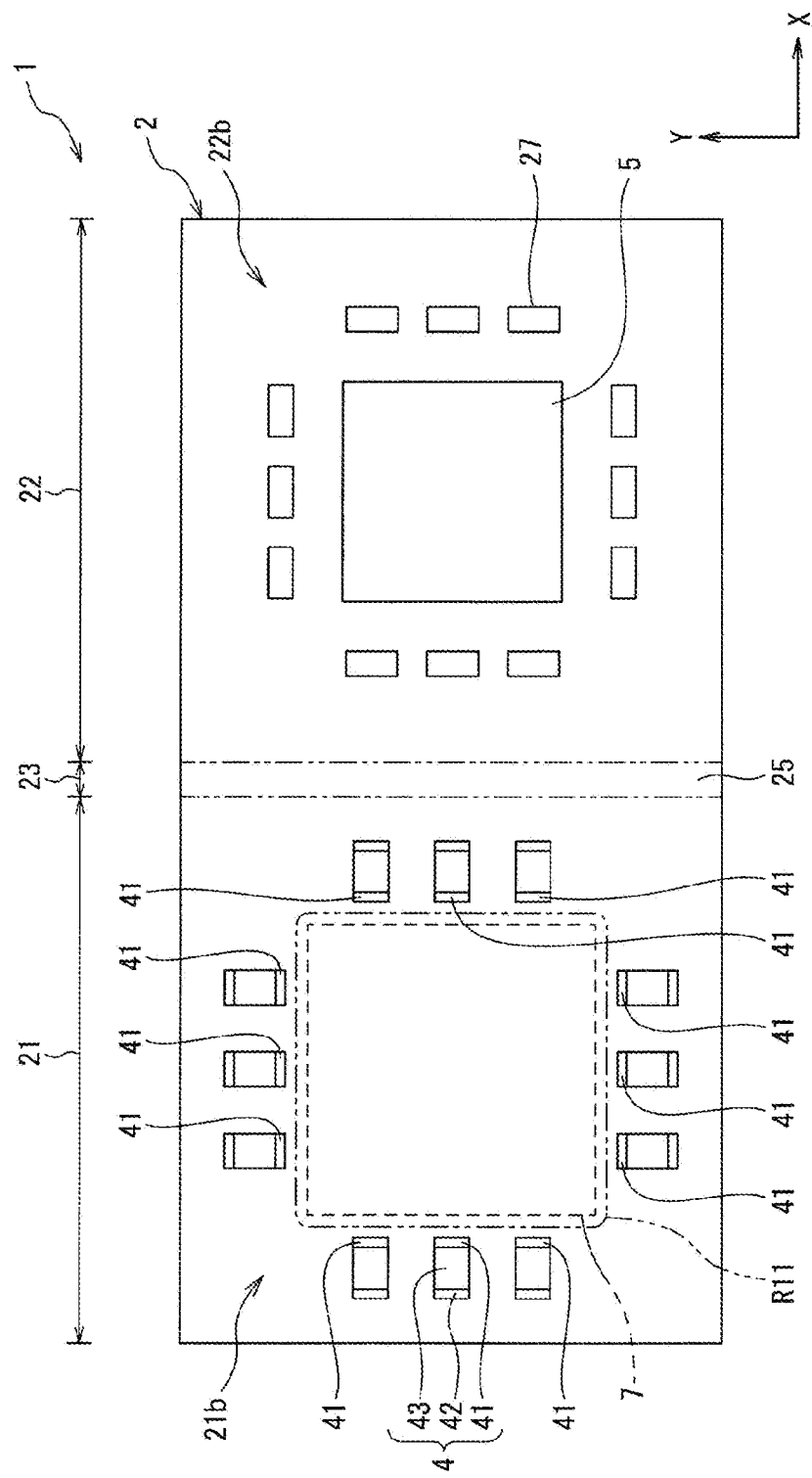
FIG. 4 is a developed view illustrating an example of a configuration of the side of the inner surface of a substrate according to the embodiment of the present disclosure.
Figure 5:
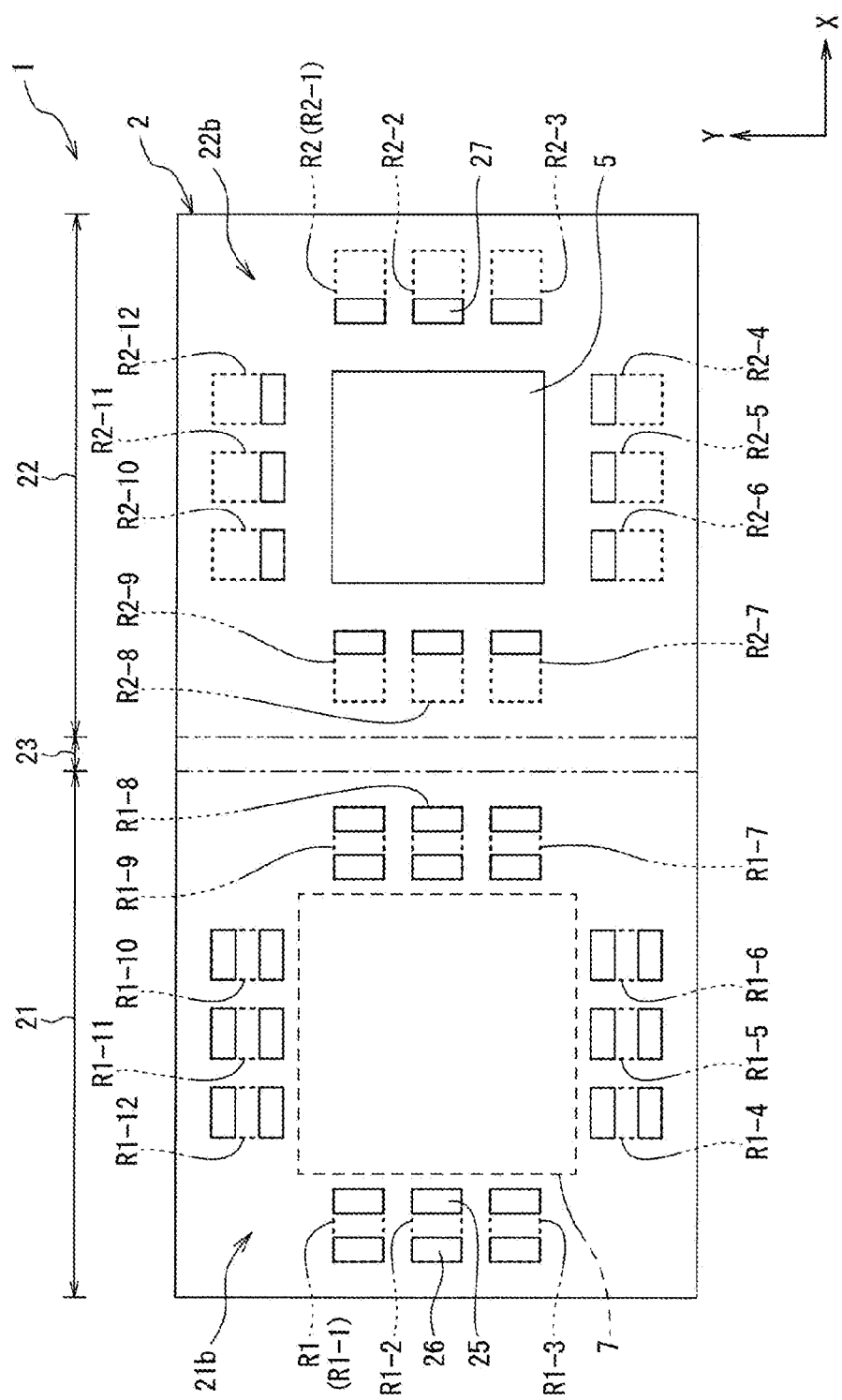
FIG. 5 is a developed view illustrating a state before the capacitor components are attached on the side of the inner surface of the substrate according to the embodiment of the present disclosure.
Figure 6:
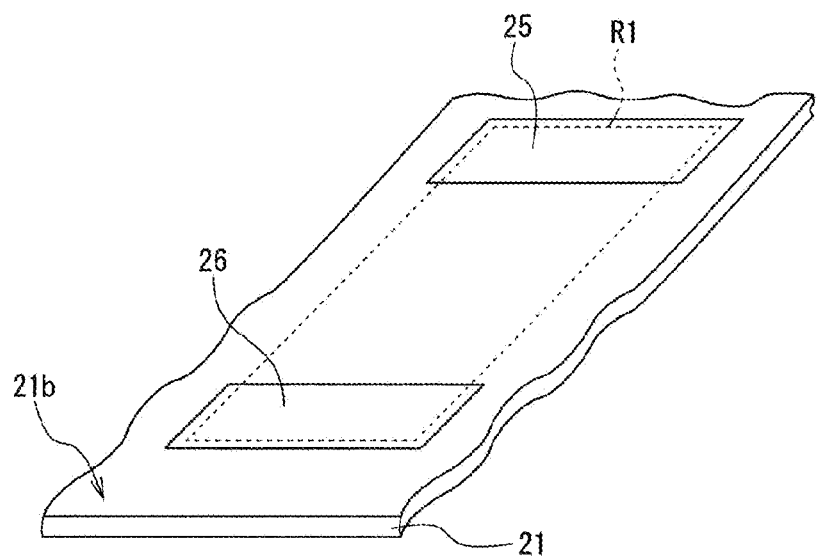
FIG. 6 is a perspective view illustrating an example of a configuration of a first region in a first substrate portion according to the embodiment of the present disclosure.
Figure 7:
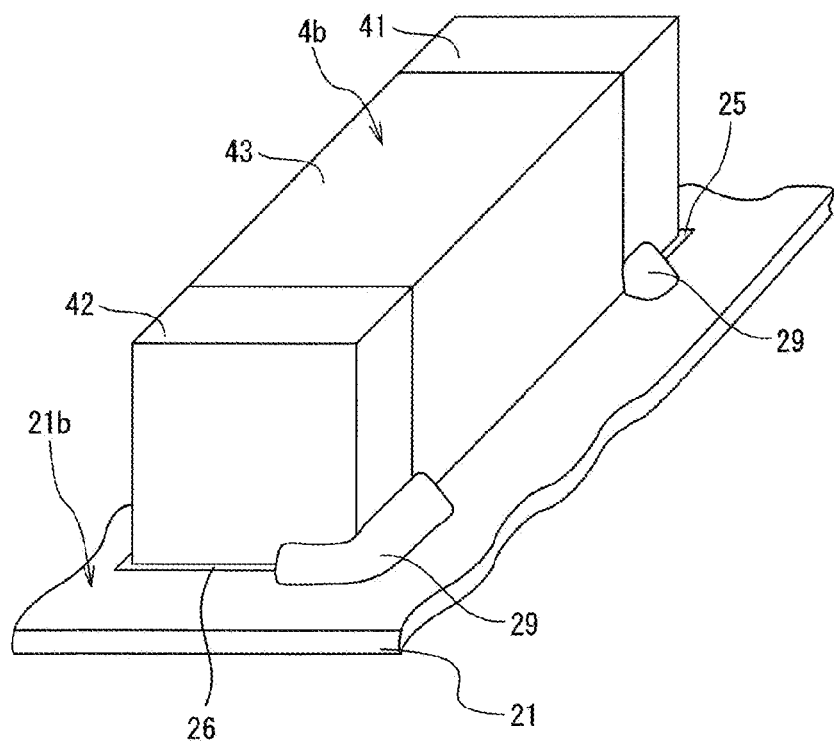
FIG. 7 is a perspective view illustrating a state where the capacitor component is attached to the first substrate portion according to the embodiment of the present disclosure.

FIG. 4 is a developed view illustrating an example of the configuration of the side of the inner surface of the substrate according to the embodiment of the present disclosure. FIG. 5 is a developed view illustrating a state before the capacitor components are attached on the side of the inner surface of the substrate according to the embodiment of the present disclosure. FIG. 6 is a perspective view illustrating an example of the configuration of a first region in the first substrate portion according to the embodiment of the present disclosure. FIG. 7 is a perspective view illustrating a state where the capacitor component is attached to the first substrate portion according to the embodiment of the present disclosure. In FIG. 7, the illustration of a solder is partly omitted in order to illustrate a positional relation between the first electrode and a first land and a positional relation between the second electrode and a second land.

As illustrated in FIG. 4, the plurality of capacitor components 4 is attached to the side of the inner surface 21b of the first substrate portion 21. In plan view, the plurality of capacitor components 4 is annularly arranged. When the substrate 2 is brought into the bent state, the electronic component 5 attached to the side of the inner surface 22b of the second substrate portion 22 is arranged within a region R11 surrounded by the plurality of capacitor components 4.

As illustrated in FIG. 4, the first electrodes 41 of the plurality of capacitor components 4 is directed to the region R11. In each of the plurality of capacitor components 4, the first electrode 41 is located closer to the region R11 than the second electrode 42. When the substrate 2 is brought into the bent state, the first electrode 41 is located closer to the electronic component 5 (or the mounting region for the electronic component 5) than the second electrode 42. When the substrate 2 is brought into the bent state, the first electrodes 41 are adjacent to the electronic component 5 (or the mounting region for the electronic component 5) arranged within the region R11.

As illustrated in FIG. 5, on the side of the inner surface 21b, the first substrate portion 21 includes a plurality of first regions R1-1 to R1-12 to which the capacitor components 4 are attached. Likewise, on the side of the inner surface 22b, the second substrate portion 22 includes a plurality of second regions R2-1 to R2-12 to which the capacitor components 4 are attached. When the substrate 2 is brought into the bent state, the first regions R1-1, R1-2, R1-3, . . . , and R1-12 of the first substrate portion 21 are respectively opposite the second regions R2-1, R2-2, R2-3, . . . , and R2-12 of the second substrate portion 22. In other words, when the substrate 2 is brought into the bent state, the first regions R1-1, R1-2, R1-3, . . . , and R1-12 are respectively overlaid on the second regions R2-1, R2-2, R2-3, . . . , and R2-12 of the second substrate portion 22 in plan view. In the following description, when the first regions R1-1, R1-2, R1-3, . . . , and R1-12 do not need to be distinguished from each other, they are referred to as the first region R1. Likewise, when the second regions R2-1, R2-2, R2-3, . . . , and R2-12 do not need to be distinguished from each other, they are referred to as the second region R2.

As illustrated in FIGS. 5 and 6, in the first region R1 of the first substrate portion 21, a first land 25 that is electrically connected to the first electrode 41 of the capacitor component 4 and a second land 26 that is electrically connected to the second electrode 42 of the capacitor component 4 are provided. As illustrated in FIG. 5, in the second regions R2 of the second substrate portion 22, a third land 27 that is electrically connected to the first electrode 41 of the capacitor component 4 is provided. When the substrate 2 is brought into the bent state, the first land 25 and the third land 27 are opposite each other. The first land 25, the second land 26, and the third land 27 include, for example, Cu or a Cu alloy. The first land 25, the second land 26, and the third land 27 are exposed from the insulating protective films (for example, a solder resist or a cover lay) covering both the surfaces of the substrate 2.

As illustrated in FIG. 7, the upper surface 4a (see FIG. 3) of the capacitor component 4 is attached through a solder 29 to the first substrate portion 21. The first electrode 41 of the capacitor component 4 is joined through the solder 29 to the first land 25 of the first substrate portion 21. The second electrode 42 of the capacitor component 4 is joined through the solder 29 to the second land 26 of the first substrate portion 21. Further, in the bent state, the lower surface 4b of the capacitor component 4 is attached through the solder to the second substrate portion 22 (see FIG. 1). The first electrode 41 of the capacitor component 4 is joined through the solder 29 to the third land 27 (see FIG. 5) of the second substrate portion 22. In this way, the first substrate portion 21 and the second substrate portion 22 are electrically connected to each other through the first electrode 41 of the capacitor component 4.

Figure 8:
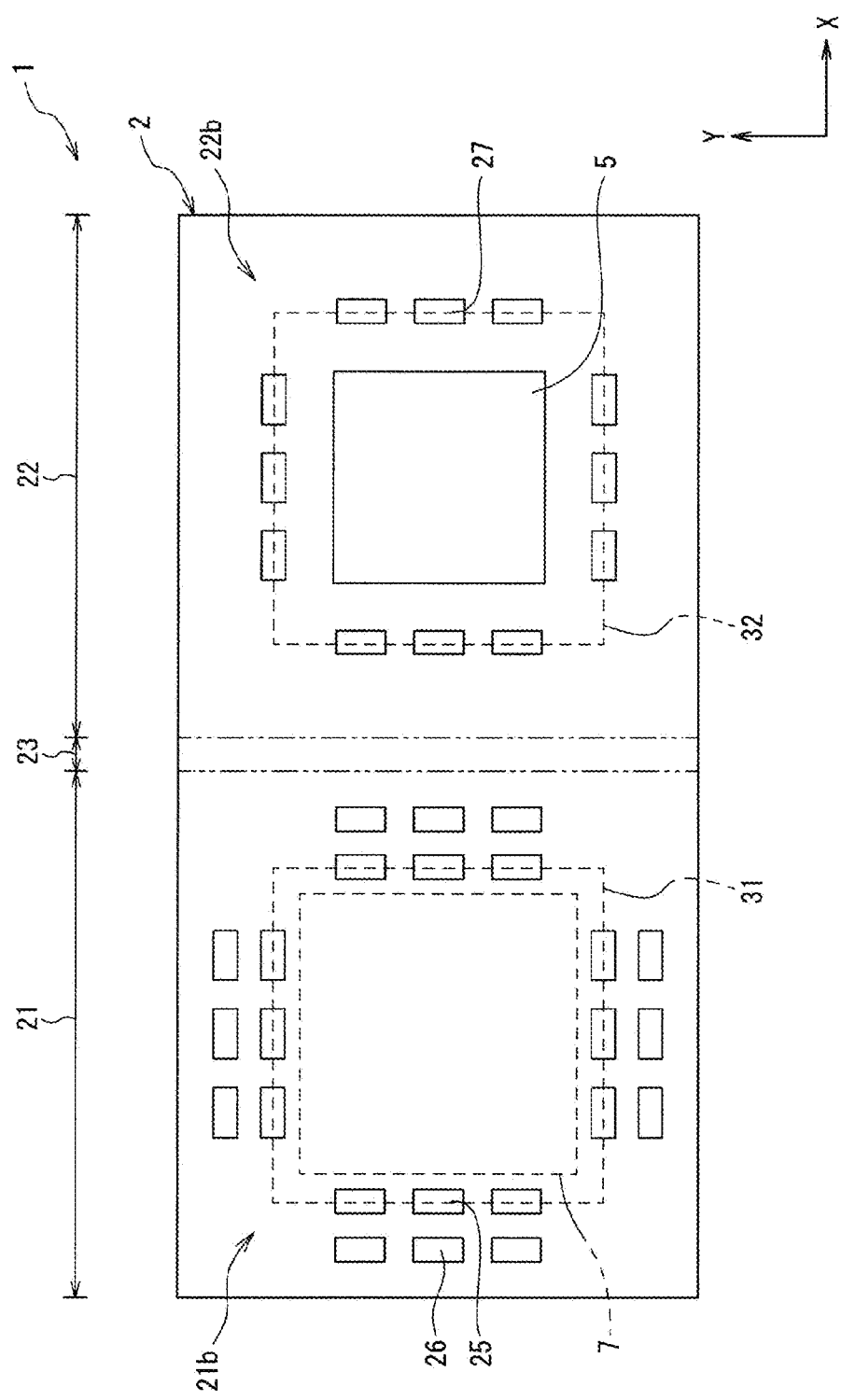
FIG. 8 is a diagram illustrating a positional relation among a first land, a second land, and a first conductive layer and a positional relation between a third land and a second conductive layer on the substrate according to the embodiment of the present disclosure.

FIG. 8 is a diagram illustrating a positional relation among the first land, the second land, and a first conductive layer and a positional relation between the third land and a second conductive layer on the substrate according to the embodiment of the present disclosure. As illustrated in FIG. 8, the first substrate portion 21 includes the first conductive layer 31 that is electrically connected to the first land 25. For example, the first conductive layer 31 is provided within the first substrate portion 21. The first conductive layer 31 is provided in such a position as to overlap at least part of the electronic component 5 (or the mounting region for the electronic component 5) in a direction (for example, the Z axis direction) in which the first substrate portion 21 and the second substrate portion 22 are opposite each other when the substrate 2 is in the bent state. In other words, the first conductive layer 31 is provided in such a position as to overlap at least part of the electronic component 5 (or the mounting region for the electronic component 5) in plan view when the substrate 2 is in the bent state. The shape of the first conductive layer 31 in plan view is rectangular. The first conductive layer 31 may be a conductive sheet without an opening portion or may be a mesh conductive sheet. The first conductive layer 31 includes, for example, Cu or a Cu alloy. The first conductive layer 31 is electrically connected to the first land 25 via through holes provided in the first substrate portion 21. When, as illustrated in FIG. 7, the capacitor component 4 is attached to the first region R1 of the first substrate portion 21, the first electrode 41 of the capacitor component 4 is electrically connected through the first land 25 to the first conductive layer 31.

The second substrate portion 22 includes the second conductive layer 32 that is electrically connected to the third land 27. For example, the second conductive layer 32 is provided within the second substrate portion 22. The second conductive layer 32 is provided in such a position as to overlap at least part of the electronic component 5 (or the mounting region for the electronic component 5) in the direction (for example, the Z axis direction) of thickness of the second substrate portion 22. In other words, the second conductive layer 32 is provided in such a position as to overlap at least part of the electronic component 5 (or the mounting region for the electronic component 5) in plan view. The shape of the second conductive layer 32 in plan view is rectangular. The second conductive layer 32 may be a conductive sheet without an opening portion or may be a mesh conductive sheet. The second conductive layer 32 includes, for example, Cu or a Cu alloy. The second conductive layer 32 is electrically connected to the third land 27 via through holes provided in the second substrate portion 22. When the capacitor component 4 is attached to the second regions R2 of the second substrate portion 22, the first electrode 41 of the capacitor component 4 is electrically connected through the third land 27 to the second conductive layer 32.

The potential of the first conductive layer 31 and the potential of the second conductive layer 32 are fixed to, for example, the ground potential (0 V). The potential of the first electrode 41 of the capacitor component 4 electrically connected to the first conductive layer 31 and the second conductive layer 32 is also fixed to, for example, the ground potential (0 V). In this way, the first conductive layer 31, the second conductive layer 32, and the first electrode 41 function as a shield that blocks electromagnetic waves. The first conductive layer 31, the second conductive layer 32, and the first electrode 41 can prevent the entry of electromagnetic waves from outside the electronic apparatus 1 (hereinafter, the outside world) into the region R11 (see FIG. 4) surrounded by the plurality of capacitor components 4 and the leakage of electromagnetic waves from the region R11 to the outside world.

Figure 9:
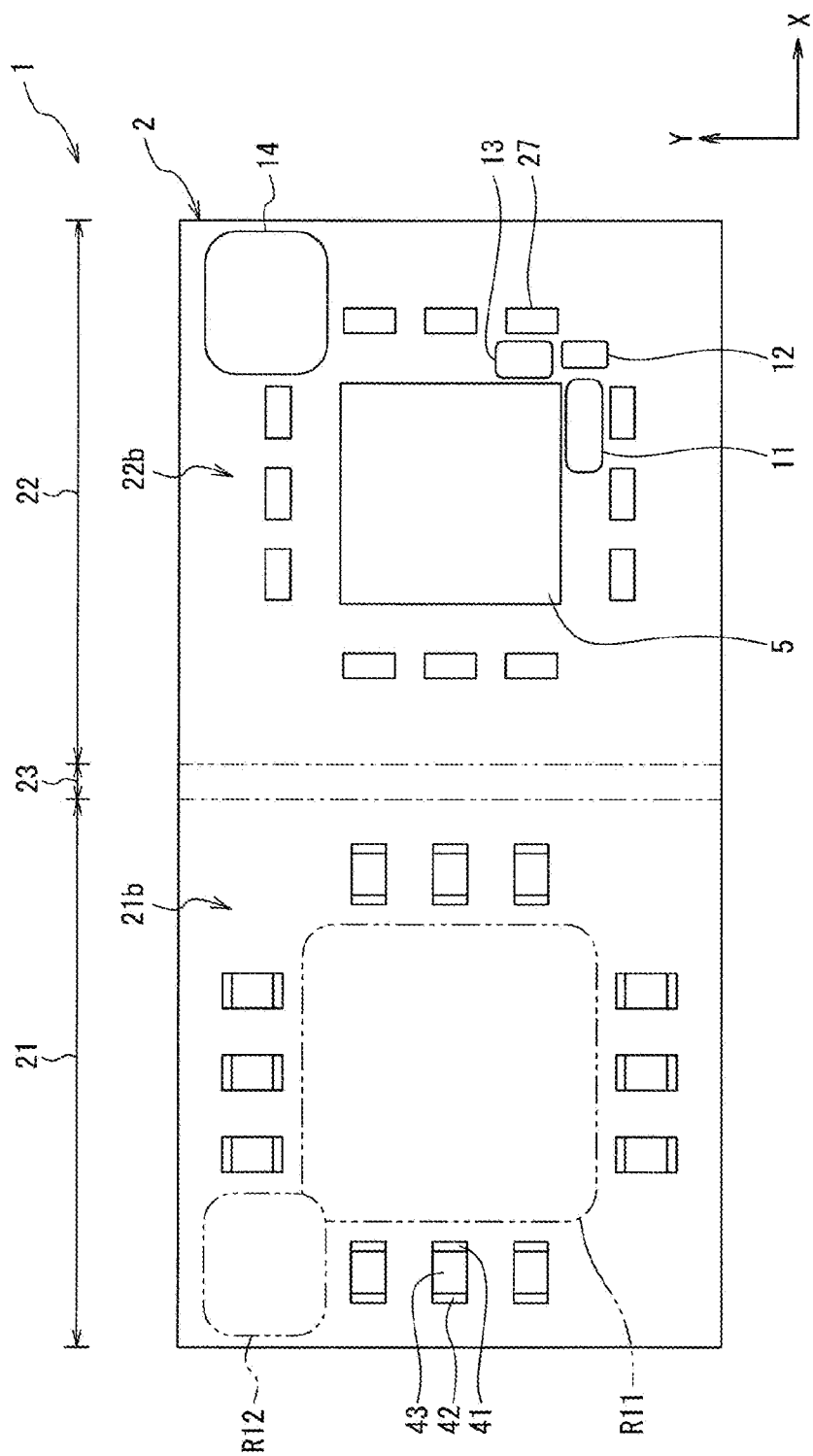
FIG. 9 is a developed view illustrating an example of the side of the inner surface of the substrate according to the embodiment of the present disclosure.

FIG. 9 is a developed view illustrating an example of the side of the inner surface of the substrate according to the embodiment of the present disclosure. As illustrated in FIG. 9, the electronic apparatus 1 may include electronic components 11, 12, 13, and 14. The electronic components 11, 12, 13, and 14 may be components that have the same functions as the electronic components 5 and 7 or may be components that have different functions from the electronic components 5 and 7. For example, the electronic components 11, 12, and 13 are ICs or surface mount devices (SMD). Examples of the SMD include a transistor, a diode, a resistor, a capacitor, and an inductor for surface mounting. The electronic component 14 is also a bus switch (USB Bus switch) including a USB interface that can be connected to the outside of the electronic apparatus 1. The electronic components 11, 12, and 13 are attached to the side of the inner surface 22b of the second substrate portion 22. When the substrate 2 is brought into the bent state, the electronic components 5, 11, 12, and 13 are arranged within the region R11 surrounded by the plurality of capacitor components 4.

It should be noted that, on the inner surface 21b of the first substrate portion 21, an electronic component is preferably prevented from being attached to the above-described region R11 and a region R12 that is opposite the electronic component 14 in the bent state. In this way, it is possible to prevent the electronic components 5, 11, 12, 13, and 14 attached to the second substrate portion 22 from making contact with the electronic component on the side of the first substrate portion 21.

Figure 10:
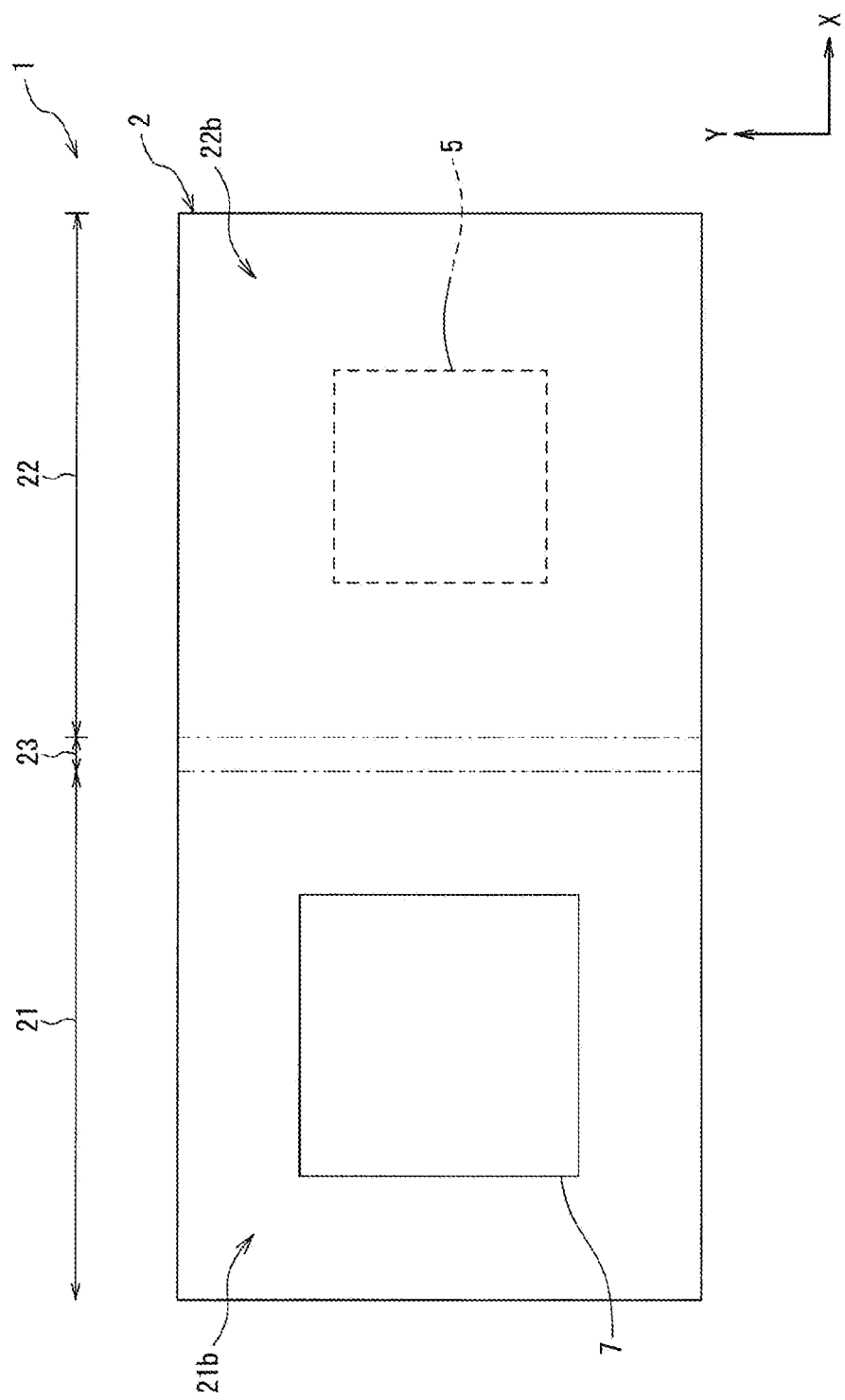
FIG. 10 is a developed view illustrating an example of a configuration of the side of the outer surface of the substrate according to the embodiment of the present disclosure.
Figure 11:
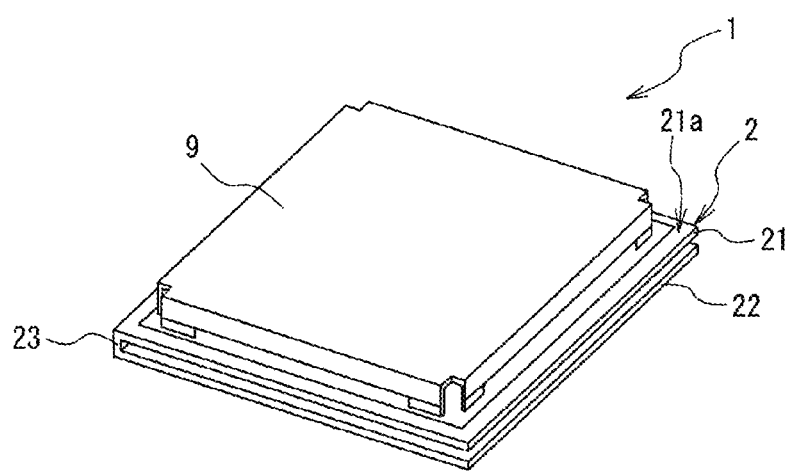
FIG. 11 is a perspective view illustrating an example of the electronic apparatus according to the embodiment of the present disclosure.

FIG. 10 is a developed view illustrating an example of the configuration of the side of the outer surface of the substrate according to the embodiment of the present disclosure. FIG. 11 is a perspective view illustrating an example of the electronic apparatus according to the embodiment of the present disclosure. As illustrated in FIG. 10, the electronic component 7 is attached to the side of the outer surface 21a of the first substrate portion 21. As illustrated in FIG. 11, the electronic apparatus 1 may include a cover 9 that is attached to the side of the outer surface 21a of the first substrate portion 21. The cover 9 is, for example, an electromagnetic shield that is formed by bending a metal plate, and covers the electronic component 7 (see FIG. 10). The cover 9 is fixed with a solder to the outer surface 21a of the first substrate portion 21.

As described above, the electronic apparatus 1 according to the embodiment of the present disclosure includes the substrate 2 and the capacitor components 4. The substrate 2 includes the first substrate portion 21 and the second substrate portion 22 arranged in a position opposite the first substrate portion 21. The capacitor components 4 is arranged between the first substrate portion 21 and the second substrate portion 22 and attached to at least one of the first substrate portion 21 and the second substrate portion 22. The capacitor component 4 includes the dielectric 43, the first electrode 41 located on one side of the dielectric 43, and the second electrode 42 located through the dielectric 43 on the side opposite to the first electrode 41. The first substrate portion 21 and the second substrate portion 22 are electrically connected to each other through the first electrode 41. For example, the first electrode 41 is fixed to a given potential. As the given potential, the ground potential (0 V) is illustrated. In this way, it is possible to reduce the size and the cost and to provide the small and inexpensive electronic apparatus 1 having a shielding function.

The first electrode 41 of the capacitor component 4 functions as a shield that blocks electromagnetic waves. The first electrode 41 of the capacitor component can prevent the entry of electromagnetic waves from outside the electronic apparatus 1 (hereinafter, the outside world) thereinto and the leakage of electromagnetic waves from within the electronic apparatus 1 to the outside world. For example, in the bent state, the first electrodes 41 of the capacitor components 4 are arranged to surround the electronic component 5 (or the mounting region for the electronic component 5). In this way, it is possible to prevent the entry of electromagnetic waves from the outside world into the electronic component 5. The electronic component 5 can be prevented from malfunctioning due to electromagnetic waves (noise) that enter thereinto. The first electrode 41 of the capacitor component 4 can also prevent the leakage of electromagnetic waves from the electronic component 5 to the outside world. In this way, other electronic components incorporated in the electronic apparatus 1 and other electronic apparatuses located around the electronic apparatus 1 can be prevented from malfunctioning due to electromagnetic waves emitted by the electronic component 5.

The size and the arrangement of the capacitor components 4 can be designed freely. For example, the thickness of the capacitor components 4 is designed to be reduced, and thus the height of the space S between the first substrate portion 21 and the second substrate portion 22 can be lowered. The capacitor components 4 can also be selectively arranged in an area where electromagnetic waves are desired to be blocked. In this way, it is possible to realize an electromagnetic shield that cannot be realized by a conventional metal-plate shield case and that is flexibly suitable, and this significantly contributes to a reduction in the size.

In a shield case, a boundary of an electromagnetic field can be inexpensively realized only by bending a metal sheet in the shape of a box and surface-mounting it on a substrate. However, when a large number of parts are bent and a large number of parts are processed, the cost thereof may be significantly increased, and there are also physical processing limits, with the result that it is difficult to realize a complicated and highly accurate shield structure. In a case where a shield case is used, since the cost thereof is increased and there are physical processing limits, a relatively large clearance (space) needs to be provided between mounted components and the shield, with the result that it is difficult to reduce the size thereof.

By contrast, in the electronic apparatus 1 according to the embodiment of the present disclosure, the electronic component 5 can be electromagnetically shielded without a shield case being arranged between the first substrate portion 21 and the second substrate portion 22. Further, the electromagnetic shield can be realized by, for example, the capacitor components 4 used for suppressing variations in power supply voltage. The electromagnetic shield for the electronic component 5 can be realized while saving space, and thus the size of the electronic apparatus can be reduced. The capacitor components 4 also function as the electromagnetic shield, and this also contributes to a reduction in the number of components.

Although in PTL 1 described above, means for forming a shielding function is provided without use of a shield case when a circuit substrate is manufactured, special facilities and complicated steps are needed in a manufacturing stage. Hence, a circuit module can be expensive. By contrast, in the electronic apparatus 1 according to the embodiment of the present disclosure, special facilities and complicated steps are not needed, and thus an electromagnetic shield structure can be inexpensively realized.

For example, the capacitor component 4 is a ceramic capacitor. The manufacturing of the capacitor components 4 and the attachment to the substrate 2 can be performed with conventional facilities. In an example, the substrate 2 is fitted to a bending jig, and in this state, the capacitor components 4 are temporarily fixed to the substrate 2. Then, the substrate 2 to which the capacitor components 4 are temporarily fixed is subjected to a soldering step (for example, a reflow step). In this way, the capacitor components 4 are fixed through the solder to the first substrate portion 21 and the second substrate portion 22, with the result that the electromagnetic shield structure is realized with the capacitor components 4.

First Modification

In the embodiment described above, a form is described in which the second electrodes 42 of the capacitor components 4 and the second substrate portion 22 are not electrically connected to each other. However, the embodiment of the present disclosure is not limited to the form as described above. The second electrodes 42 and the second substrate portion 22 may be electrically connected to each other.

Figure 12:
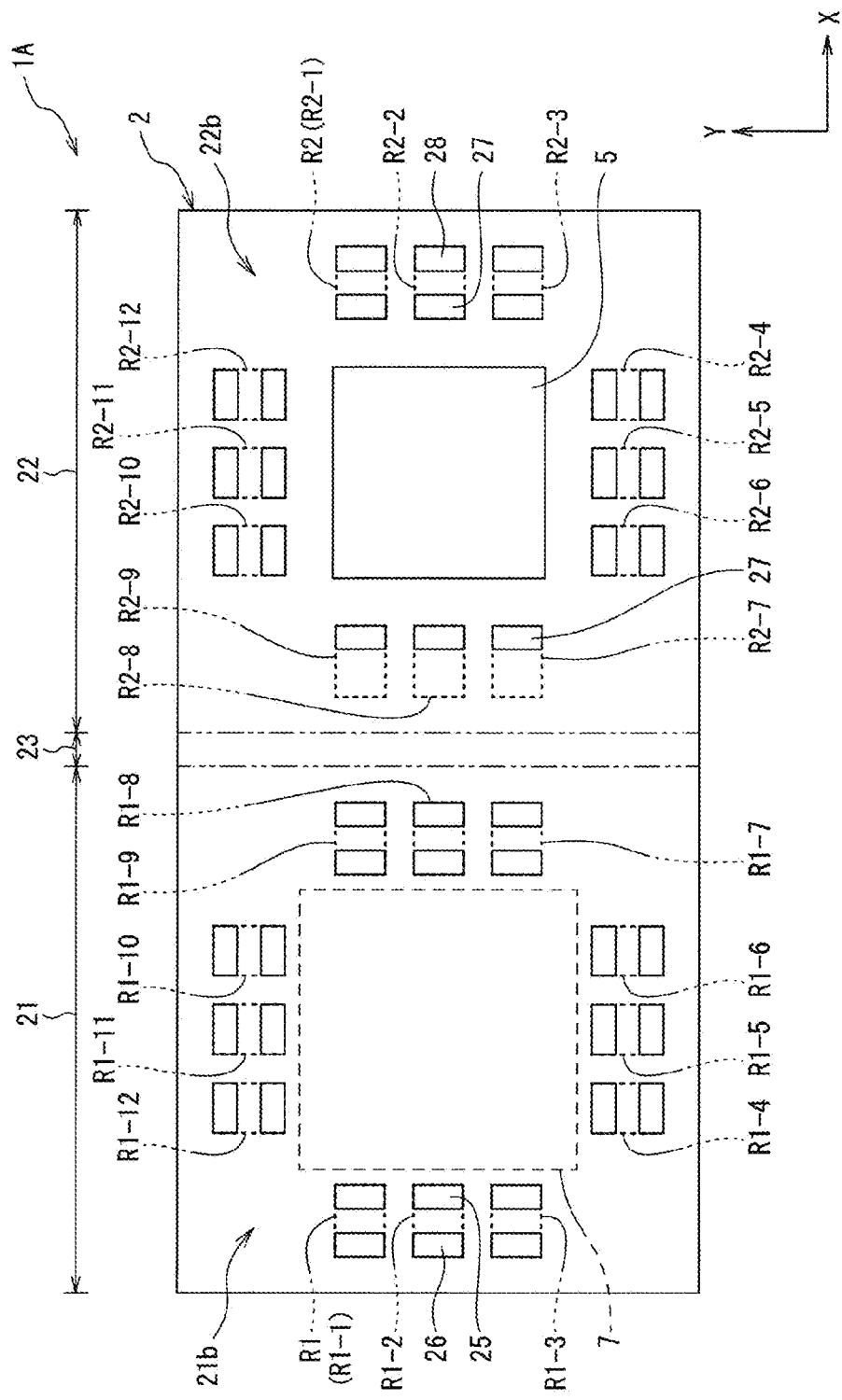
FIG. 12 is a diagram illustrating an electronic apparatus according to a first modification of the embodiment of the present disclosure.

FIG. 12 is a diagram illustrating an electronic apparatus according to a first modification of the embodiment of the present disclosure. As illustrated in FIG. 12, in an electronic apparatus 1A according to the first modification, a fourth land 28 for electrically connecting to the second electrodes 42 of the capacitor components 4 is provided in at least part of the second region R2 of the second substrate portion 22. The fourth land 28 includes, for example, Cu or a Cu alloy. The fourth land 28 is exposed from the insulating protective films (for example, a solder resist or a cover lay) covering both the surfaces of the substrate 2. The second electrodes 42 of the capacitor components 4 and the fourth land 28 are joined together through the solder.

As compared with a form illustrated in FIG. 5, the joining area of the capacitor components 4 and the second substrate portion 22 is increased, and thus it is possible to increase the joining strength of the capacitor components 4 and the second substrate portion 22. It is also possible to supply power from the first substrate portion 21 through the second electrodes 42 of the capacitor components 4 to the second substrate portion 22. Since the second electrodes 42 can be used as wiring for power supply, it is also possible to enhance the flexibility of the design of the substrate 2.

Second Modification

In the embodiment described above, a form is described in which the substrate 2 is bent such that the connection portion 23 is perpendicular to the first substrate portion 21 and that the connection portion 23 is perpendicular to the second substrate portion 22 (see, for example, FIG. 1). However, the embodiment of the present disclosure is not limited to the form as described above. The substrate 2 may be gently bent without the formation of corners.

Figure 13:
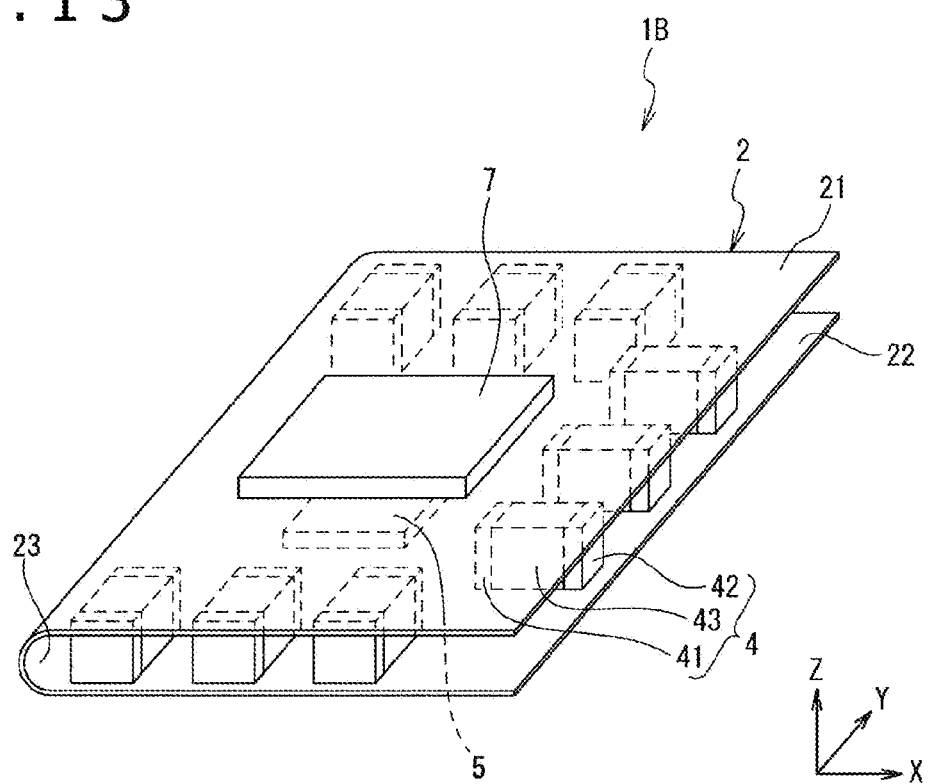
FIG. 13 is a diagram illustrating an electronic apparatus according to a second modification of the embodiment of the present disclosure.

FIG. 13 is a diagram illustrating an electronic apparatus according to a second modification of the embodiment of the present disclosure. As illustrated in FIG. 13, in an electronic apparatus 1B according to the second modification, the degree of bending around the connection portion 23 of the substrate 2 is moderate without the formation of corners as compared with a form illustrated in FIG. 1. Parts around the connection portion 23 are gently curved. In the form as described above, it is likely that a load (mechanical stress) applied to the parts around the connection portion 23 can be reduced.

Further, in the embodiment described above, a form in which the plurality of capacitor components 4 is annularly arranged is described (see, for example, FIG. 1). However, the embodiment of the present disclosure is not limited to the form as described above. The plurality of capacitor components 4 does not need to be annularly arranged. For example, as illustrated in FIG. 13, the plurality of capacitor components 4 may be arranged such that a ring is opened in positions adjacent to the connection portion 23. Alternatively, the plurality of capacitor components 4 may not be arranged so as to form a ring and may be individually arranged in the vicinity of an electronic component which is desired to be electromagnetically shielded. The capacitor components 4 are arranged such that the first electrodes 41 are directed to the electronic component which is desired to be electromagnetically shielded. Even in the form as described above, the first electrodes 41 of the capacitor components 4 function as the electromagnetic shield.

Third Modification

In the description of the embodiment mentioned above, the substrate 2 is a single sheet of flexible substrate. However, the embodiment of the present disclosure is not limited to this configuration. The first substrate portion 21 and the second substrate portion 22 may include separate flexible substrates that are separated from each other. In this case, the first substrate portion 21 and the second substrate portion 22 may be connected to each other with unillustrated wiring or connection components. Further, at least one of the first substrate portion 21 and the second substrate portion 22 may be a rigid substrate.

Figure 14:
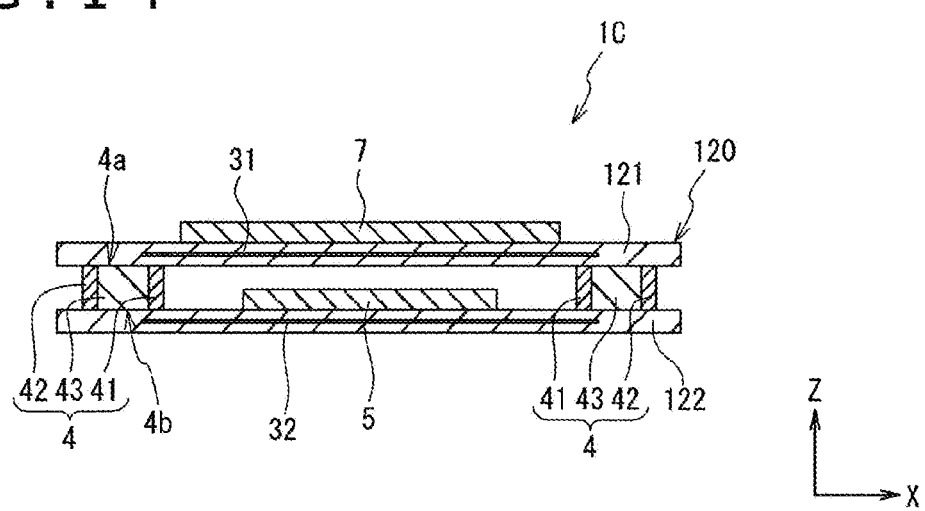
FIG. 14 is a cross-sectional view illustrating an example of the configuration of an electronic apparatus according to a third modification of the embodiment of the present disclosure.

FIG. 14 is a cross-sectional view illustrating an example of the configuration of an electronic apparatus according to a third modification of the embodiment of the present disclosure. As illustrated in FIG. 14, an electronic apparatus 1C according to the third modification includes a substrate 120 including a first substrate portion 121 and a second substrate portion 122 arranged in a position opposite the first substrate portion 121. The first substrate portion 121 and the second substrate portion 122 each are rigid substrates. In the first substrate portion 121, a first conductive layer 31, a first land 25 electrically connected to the first conductive layer 31, and a second land 26 are provided. In the second substrate portion 122, a second conductive layer 32 and a third land 27 that is electrically connected to the second conductive layer 32 are provided.

Further, the electronic apparatus 1C includes a plurality of capacitor components 4 arranged between the first substrate portion 121 and the second substrate portion 122 and attached to the first substrate portion 121 and the second substrate portion 122. The first electrodes 41 of the capacitor components 4 are electrically connected through the first land 25 to the first conductive layer 31 and are electrically connected through the third land 27 to the second conductive layer 32. In addition, the second electrodes 42 of the capacitor components 4 are electrically connected to the second land 26. The first conductive layer 31, the second conductive layer 32, and the first electrodes 41 are fixed to, for example, the ground potential (0 V). Moreover, the second electrodes 42 are connected to the power supply potential. Even in the form as described above, the first conductive layer 31, the second conductive layer 32, and the first electrodes 41 function as a shield that blocks electromagnetic waves.

Other Embodiments

Although, as described above, in the present disclosure, the embodiment and the modifications are used, it should not be understood that the statements and drawings forming parts of this disclosure are intended to limit the present disclosure. Various other embodiments, examples, and operational techniques will be obvious from this disclosure to a person skilled in the art.

For example, even in a case where a shielding function is not needed in an electronic apparatus, capacitor components can be utilized as a technique for reducing the size and the cost. In this case, signals other than a fixed potential are passed through both the first electrode 41 and the second electrode 42, and thus the capacitor components 4 can be used as an interposer that connects a signal on the first substrate portion 21 and a signal on the second substrate portion 22.

Although, in the embodiment and modifications described above, as an example of the surface mount device of the present disclosure, the capacitor component 4 is described, this is only an example. The surface mount device of the present disclosure is not limited to the capacitor component, and may be, for example, a chip inductor or a chip ferrite bead. In this case, an inductor covered with a chip ceramic or an inductor covered with a chip ferrite is an example of the freely-selected component of the present disclosure.

Alternatively, the surface mount device of the present disclosure may also be a surface-mounted LED (Light Emitting Diode) of a side light emission type that emits light in a horizontal direction (for example, the X axis direction or the Y axis direction). In this case, the surface-mounted LED is an example of the freely-selected component of the present disclosure. In the surface-mounted LED, one of an anode terminal and a cathode terminal is an example of the first electrode of the present disclosure, and the other of the anode terminal and the cathode terminal is an example of the second electrode of the present disclosure. The anode terminal and the cathode terminal do not need to be opposite the first substrate portion or the second substrate portion serving as the mounting surface of the surface-mounted LED.

As described above, the present technique naturally includes various embodiments and the like that are not described herein. At least one of various omissions, replacements, and modifications of constituent elements can be performed without departing from the spirit of the embodiment and modifications described above. Further, the effects described in the present specification are only illustrative and not restrictive, and other effects may be achieved.

The present disclosure can also take configurations as described below.

(1) An electronic apparatus including:
a substrate including a first substrate portion and a second substrate portion arranged in a position opposite the first substrate portion; and
a capacitor component arranged between the first substrate portion and the second substrate portion and attached to at least one of the first substrate portion and the second substrate portion,
in which the capacitor component includes
a dielectric,
a first electrode located on one side of the dielectric, and
a second electrode located through the dielectric on a side opposite to the first electrode, and
the first substrate portion and the second substrate portion are electrically connected to each other through the first electrode.

(2) The electronic apparatus described in (1) above,
in which the first electrode is fixed to a given potential.

(3) The electronic apparatus described in (1) or (2) above,
in which the second substrate portion includes a mounting region for an electronic component on a side of a surface opposite the first substrate portion, and
the first electrode is located closer to the mounting region than the second electrode.

(4) The electronic apparatus described in (3) above, in which the first electrode is adjacent to the mounting region.

(5) The electronic apparatus described in (4) above, further including:
a plurality of the capacitor components, in which the plurality of the capacitor components is arranged to surround the mounting region.

(6) The electronic apparatus described in any one of (3) to (5) above, further including:
an electronic component mounted on the mounting region.

(7) The electronic apparatus described in any one of (3) to (6) above,
in which the first substrate portion includes a first conductive layer provided in such a position as to overlap at least part of the mounting region in a direction in which the first substrate portion and the second substrate portion are opposite each other, and
the first conductive layer is electrically connected to the first electrode.

(8) The electronic apparatus described in any one of (3) to (7) above,
in which the second substrate portion includes a second conductive layer provided in such a position as to overlap at least part of the mounting region in a direction of thickness of the second substrate portion, and
the second conductive layer is electrically connected to the first electrode.

(9) The electronic apparatus described in any one of (1) to (8) above,
in which the first substrate portion includes
a first land electrically connected to the first electrode, and
a second land electrically connected to the second electrode,
the second substrate portion includes
a third land electrically connected to the first electrode, and
the first land and the third land are opposite each other.

(10) The electronic apparatus described in any one of (1) to (9) above,
in which the substrate includes a flexible substrate.

(11) A substrate including:
a first substrate portion; and
a second substrate portion arranged in a position opposite the first substrate portion,
in which the first substrate portion includes a first region to which a capacitor component is attached,
the second substrate portion includes a second region to which the capacitor component is attached, and
the first region and the second region are opposite each other.

(12) The substrate described in (11) above,
in which the first region includes a first land electrically connected to a first electrode included in the capacitor component,
the second region includes a second land electrically connected to the first electrode, and
the first land and the second land are opposite each other.

(13) An electronic apparatus including:
a substrate including a first substrate portion and a second substrate portion arranged in a position opposite the first substrate portion; and
a surface mount device arranged between the first substrate portion and the second substrate portion and attached to at least one of the first substrate portion and the second substrate portion,
in which the surface mount device includes
a freely-selected component,
a first electrode located on one side of the freely-selected component, and
a second electrode arranged away from the first electrode through the freely-selected component, and the first substrate portion and the second substrate portion are electrically connected to each other through the first electrode.

REFERENCE SIGNS 1, 1A, 1B, 1C: Electronic apparatus
2, 120: Substrate
4: Capacitor component
4a: Upper surface
4b: Lower surface
5, 7, 11 to 14: Electronic component
9: Cover
21, 121: First substrate portion
21a, 22a: Outer surface
21b, 22b: Inner surface
22, 122: Second substrate portion
23: Connection portion
25: First land
26: Second land
27: Third land
28: Fourth land
31: First conductive layer
32: Second conductive layer
41: First electrode
42: Second electrode
43: Dielectric
R1, R1-1 to R1-12: First region
R2, R2-1 to R2-12: Second region
R11, R12: Region
S: Space

The invention claimed is:
1. An electronic apparatus, comprising:
a flexible substrate that includes:
a first substrate portion;
a second substrate portion opposite to the first substrate portion; and
a connection portion that connects the first substrate portion and the second substrate portion; and
a plurality of capacitor components between an inner surface of the first substrate portion and an inner surface of the second substrate portion, wherein
each capacitor component of the plurality of capacitor components includes an upper surface and a lower surface,
the upper surface of each capacitor component of the plurality of capacitor components is surface-mounted to the inner surface of the first substrate portion,
the lower surface of each capacitor component of the plurality of capacitor components is surface-mounted to the inner surface of the second substrate portion,
the inner surface of the first substrate portion and the inner surface of the second substrate portion face inward of the first substrate portion and the second substrate portion, respectively,
each capacitor component of the plurality of the capacitor components includes:
a dielectric;
a first electrode on a first side of the dielectric; and
a second electrode on a second side of the dielectric;
the second side of the dielectric is opposite to the first side of the dielectric,
the first substrate portion is electrically connected to the second substrate portion via the first electrode, and each of the first electrode and the second electrode is attached to both the first substrate portion and the second substrate portion.

2. The electronic apparatus according to claim 1, wherein the first electrode is fixed to a given potential.

3. The electronic apparatus according to claim 1, further comprising an electronic component on the inner surface of the second substrate portion, wherein
the second substrate portion includes a mounting region for the electronic component, and
the first electrode is closer to the mounting region than the second electrode.

4. The electronic apparatus according to claim 3, wherein the first electrode is adjacent to the mounting region.

5. The electronic apparatus according to claim 4, wherein the plurality of the capacitor components surrounds the mounting region.

6. The electronic apparatus according to claim 3, wherein the electronic component is on the mounting region.

7. The electronic apparatus according to claim 3, wherein
the first substrate portion includes a first conductive layer,
the first substrate portion is opposite to the second substrate portion in a direction,
the first conductive layer overlaps a part of the mounting region in the direction, and
the first conductive layer is electrically connected to the first electrode.

8. The electronic apparatus according to claim 3, wherein
the second substrate portion further includes a second conductive layer,
the second conductive layer overlaps a part of the mounting region in a direction of thickness of the second substrate portion, and
the second conductive layer is electrically connected to the first electrode.

9. The electronic apparatus according to claim 1, wherein
the first substrate portion includes:
a first land electrically connected to the first electrode; and
a second land electrically connected to the second electrode,
the second substrate portion includes a third land electrically connected to the first electrode, and
the first land is opposite to the third land.

10. A flexible substrate, comprising:
a first substrate portion;
a second substrate portion opposite to the first substrate portion; and
a connection portion that connects the first substrate portion and the second substrate portion, wherein
an inner surface of the first substrate portion includes a first region,
a plurality of capacitor components is attached to the first region,
each capacitor component of the plurality of capacitor components includes an upper surface and a lower surface,
the upper surface of each capacitor component of the plurality of capacitor components is surface-mounted to the inner surface of the first substrate portion,
an inner surface of the second substrate portion includes a second region,
the plurality of capacitor components is attached to the second region,
the lower surface of each capacitor component of the plurality of capacitor components is surface-mounted to the inner surface of the second substrate portion,
the inner surface of the first substrate portion and the inner surface of the second substrate portion face inward of the first substrate portion and the second substrate portion, respectively,
the first region is opposite to the second region,
each capacitor component of the plurality of the capacitor components includes:
a dielectric;
a first electrode on a first side of the dielectric; and
a second electrode on a second side of the dielectric,
and each of the first electrode and the second electrode is attached to both the first substrate portion and the second substrate portion.

11. The flexible substrate according to claim 10, wherein
the first region includes a first land electrically connected to the first electrode,
the second region includes a second land electrically connected to the first electrode, and
the first land is opposite to the second land.

12. An electronic apparatus, comprising:
a flexible substrate that includes:
a first substrate portion;
a second substrate portion opposite to the first substrate portion; and
a connection portion that connects the first substrate portion and the second substrate portion; and
a plurality of surface mount devices between an inner surface of the first substrate portion and an inner surface of the second substrate portion, wherein
each surface mount device of the plurality of surface mount devices includes an upper surface and a lower surface,
the upper surface of each surface mount device of the plurality of surface mounted devices is surface-mounted to the inner surface of the first substrate portion,
the lower surface of each surface mount device of the plurality of surface mount devices is surface-mounted to the inner surface of the second substrate portion,
the inner surface of the first substrate portion and the inner surface of the second substrate portion face inward of the first substrate portion and the second substrate portion, respectively,
each surface mount device of the plurality of the surface mount devices includes:
a freely-selected component;
a first electrode on a first side of the freely-selected component; and
a second electrode on a second side of the freely-selected component,
the second side of the freely-selected component is opposite to the first side of the freely-selected component,
the first substrate portion is electrically connected to the second substrate portion via the first electrode, and
each of the first electrode and the second electrode is attached to both the first substrate portion and the second substrate portion.

13. The electronic apparatus according to claim 1, wherein the first substrate portion includes:
a first land electrically connected to the first electrode; and a second land electrically connected to the second electrode, the second substrate portion includes a fourth land electrically connected to the second electrode, and the second land is opposite to the fourth land.

14. The electronic apparatus according to claim 1, wherein the plurality of capacitor components is in a ring arrangement between the first substrate portion and the second substrate portion, and the plurality of capacitor components is adjacent to the connection portion.

15. The electronic apparatus according to claim 1, further comprising:

an electronic component on the inner surface of the second substrate portion; and a gap between an upper surface of the electronic component and the inner surface of the first substrate portion.

16. The electronic apparatus according to claim 1, further comprising an electronic component attached to the inner surface of the second substrate portion, wherein the plurality of capacitor components surrounds a region, the electronic component is in the region, and the first electrode is configured to block entry of electromagnetic waves from outside into the electronic component.

17. The electronic apparatus according to claim 1, further comprising:

a wiring layer, having a wiring pattern, on each of the inner surface of the first substrate portion and the inner surface of the second substrate portion; and an insulating layer that connects to the wiring pattern.

18. The electronic apparatus according to claim 1, wherein the connection portion that is in a bent state, and wherein the connection portion connects the first substrate portion to the second substrate portion.

* * * * *